United States Patent
Subotski et al.

(10) Patent No.: US 11,482,853 B2
(45) Date of Patent: Oct. 25, 2022

(54) POWER DELIVERY CONTROL AND OVER CURRENT PROTECTION

(71) Applicant: Infineon Technologies Austria AG, Villach (AT)

(72) Inventors: Aliaksandr Subotski, Villach (AT); David Grant Cox, Rosegg (AT); Jorge Arturo Ramirez Rivero, Villach (AT)

(73) Assignee: Infineon Technologies Austria AG, Villach (AT)

( * ) Notice: Subject to any disclaimer, the term of this patent is extended or adjusted under 35 U.S.C. 154(b) by 37 days.

(21) Appl. No.: 16/995,012

(22) Filed: Aug. 17, 2020

(65) Prior Publication Data

US 2022/0052601 A1 Feb. 17, 2022

(51) Int. Cl.
| | | |
|---|---|---|
| *H02M 3/08* | (2006.01) | |
| *H02H 3/08* | (2006.01) | |
| *H02M 1/00* | (2006.01) | |
| *H02M 1/08* | (2006.01) | |
| *H02M 1/32* | (2007.01) | |

(52) U.S. Cl.
CPC ............ *H02H 3/08* (2013.01); *H02M 1/0009* (2021.05); *H02M 1/08* (2013.01); *H02M 1/32* (2013.01)

(58) Field of Classification Search
CPC ........ H02M 1/32; H02M 1/0009; H02H 3/08; H02H 3/093; H02H 3/0935; G01R 19/02
See application file for complete search history.

(56) References Cited

U.S. PATENT DOCUMENTS

| | | | |
|---|---|---|---|
| 4,432,031 A | 2/1984 | Premerlani | |
| 4,642,564 A | 2/1987 | Hurley | |
| 6,617,858 B1* | 9/2003 | Baumgaertl | G01R 19/2509 324/424 |
| 2003/0107863 A1 | 6/2003 | Kelwaski | |
| 2012/0043944 A1* | 2/2012 | Nguyen | H02M 3/156 323/283 |

(Continued)

FOREIGN PATENT DOCUMENTS

| | | |
|---|---|---|
| EP | 2592736 A2 | 5/2013 |
| EP | 2592736 A3 | 7/2015 |

OTHER PUBLICATIONS

Extended Search Report, EP 21190611.0, pp. 1-7, dated Jan. 25, 2022.

*Primary Examiner* — Alex Torres-Rivera
(74) *Attorney, Agent, or Firm* — Armis IP Law, LLC

(57) ABSTRACT

An apparatus comprises a switch, a current monitor, and a controller. During operation, the switch controls an amount of current through the load. The current monitor samples a magnitude of the current through the load, a magnitude of which varies over time during a time duration. Based on integrating the sample magnitudes of the current through the load over the time duration, the current monitor produces a current sense value. The current sense value is representative of an amount of current through the load. The controller controls an operational state of the switch based upon a comparison of the current sense value with respect to an over-current threshold value. For example, in response to detecting a condition in which the current sense value is greater than the overcurrent threshold value, the controller turns OFF (deactivates) the switch, reducing or eliminating delivery of current through the load.

32 Claims, 9 Drawing Sheets

(56) References Cited

U.S. PATENT DOCUMENTS

| | | | |
|---|---|---|---|
| 2016/0203932 A1* | 7/2016 | Niehoff | H01H 9/542 |
| | | | 361/170 |
| 2017/0038784 A1* | 2/2017 | Rahman | H02H 3/08 |
| 2018/0294727 A1* | 10/2018 | Klein | H02M 3/1582 |
| 2020/0076349 A1* | 3/2020 | Balakrishnan | G01R 31/346 |

* cited by examiner

POWER DELIVERY CONTROL AND OVER CURRENT PROTECTION

BACKGROUND

Conventional power delivery systems include protection circuits such as smart e-fuses and hot swap controllers that implement overcurrent (OC) protection. In certain instances, a conventional protection circuit implementation is a peak current detector with a deglitch time. The conventional protection circuit initiates a shut-down condition protection if detected current is at or above an OC limit during the deglitch time.

BRIEF DESCRIPTION

This disclosure includes the observation that overcurrent monitoring and control techniques suffer from deficiencies. For example, as long as the deglitch time is not exceeded, current can alternate above and below the overcurrent limit, resulting in an RMS current higher than the maximum allowed overcurrent level. It is noted that RMS current above a threshold value can cause damage to circuit wiring, load, etc. Thus, certain conventional circuits are susceptible to damage.

Embodiments herein include novel ways of protecting against overcurrent conditions.

More specifically, embodiments herein include an apparatus comprising a switch, a current monitor, and a controller. During operation, the switch controls an amount of current through the load. The current monitor samples a magnitude of the current through the load, a magnitude of which varies over time during a time duration. Based on integrating the sample magnitudes of the current through the load over the time duration, the current monitor produces a current sense value. The current sense value is representative of an amount of current through the switch and the load. The controller controls an operational state of the switch based upon a comparison of the current sense value with respect to an over-current threshold value.

As a more specific example, in response to detecting a condition in which the current sense value is greater than the overcurrent threshold value, the controller initiates turning off (deactivating) the switch. Deactivation of the switch substantially reduces or eliminates the current through the load.

Conversely, in one embodiment, in response to detecting a condition in which the current sense value is less than the overcurrent threshold value, the controller continues to activate the switch such that current continues flows through the load. In other words, if there is no overcurrent condition detected, the controller continues to activate the switch to an ON state to power the load.

Note that the current monitor can be configured in any suitable manner. For example, in one embodiment, the current monitor produces the current sense value as a squared approximation of an RMS (Root Mean Square) current through the load during the time duration. In yet further example embodiments, the current monitor receives an RMS current limit value to be used as a threshold value; the current monitor squares the received RMS (Root Mean Square) current limit value to produce the overcurrent threshold value. In such an instance, the current monitor compares the squared approximation of the RMS current through the load to the squared RMS current limit value in order to determine a respective overcurrent condition.

Further example embodiments herein include, via the current monitor, and in furtherance of producing the current sense value as a squared approximation of an RMS (Root Mean Square) current through the load during the time duration: squaring each of the sample magnitudes of the current over the time duration (integration cycle); summing the squared sample magnitudes of the current; and dividing a summation of the squared sample magnitudes of the current by a predetermined value, the predetermined value being based on a number of the sample magnitudes of the current obtained during the time duration (integration cycle).

In yet further example embodiments, the current monitor includes a first multiplier stage and a second multiplier stage. Via the first multiplier stage, the current monitor derives the current sense value based at least in part on squaring each of the sample magnitudes of the current over the time duration. Via the second multiplier stage, the current monitor derives the overcurrent threshold value based at least in part on squaring a received current limit value. In one embodiment, as previously discussed, the received current limit value is an RMS (Root Mean Square) current limit value. The current sense value represents a squared approximation of an RMS (Root Mean Square) current through the load.

Accordingly, embodiments herein include, via the current monitor, deriving the current sense value from the sample magnitudes of the current through the load over the time duration; and deriving the overcurrent threshold value from a received current limit value.

In accordance with still further example embodiments, the current monitor derives the current sense value based at least in part on squaring each of the sample magnitudes of the current over the time duration, summing the squares of the sample magnitudes of the current, dividing a summation of the squares of the sample magnitudes of the current by a predetermined value. The predetermined value is based on a number of the sample magnitudes of the current obtained during the (integration) time duration. The received current limit value is an RMS (Root Mean Square) current value; the current monitor produces the overcurrent threshold value based on squaring the RMS current value.

Embodiments in herein are useful over conventional techniques. For example, sampling of the current through a load and producing a respective current sense value for a time duration as described herein provides a way to provide better overcurrent protection than merely monitoring and triggering an overcurrent condition during a transient current consumption spike by the load. Additionally, the novel integration (such as summing) of squared current samples over multiple sampling cycles and implementation of a bit shifting division produces a current sense value representing a squared approximation of an RMS (Root Mean Square) current through the load and comparison to a squared RMS (Root Mean Square) current value simplifies circuitry needed to implement overcurrent protection.

In one configuration, embodiments herein are implemented as a smart e-fuse and RMS OC detector that protects distribution networks and loads based on precisely detected RMS currents, achieving fast system reaction time (e-fuse FET opening by detector's signal).

These and other more specific embodiments are disclosed in more detail below.

Note that although embodiments as discussed herein are applicable to overcurrent protection applications, the concepts disclosed herein may be advantageously applied to any other suitable topologies as well as general power supply control applications.

Note further that one or more computerized devices or processors can be programmed and/or configured to operate as explained herein to carry out the different embodiments as described herein.

Yet other embodiments herein include software programs to perform the steps and operations summarized above and disclosed in detail below. One such embodiment comprises a computer program product including a non-transitory computer-readable storage medium (i.e., any computer readable hardware storage medium) on which software instructions are encoded for subsequent execution. The instructions, when executed in a computerized device (hardware) having a processor, program and/or cause the processor (hardware) to perform the operations disclosed herein. Such arrangements are typically provided as software, code, instructions, and/or other data (e.g., data structures) arranged or encoded on a non-transitory computer readable storage medium such as an optical medium (e.g., CD-ROM), floppy disk, hard disk, memory stick, memory device, etc., or other a medium such as firmware in one or more ROM, RAM, PROM, etc., or as an Application Specific Integrated Circuit (ASIC), etc. The software or firmware or other such configurations can be installed onto a computerized device to cause the computerized device to perform the techniques explained herein.

Accordingly, embodiments herein are directed to methods, systems, computer program products, etc., that support operations as discussed herein.

One embodiment herein includes a computer readable storage medium and/or system having instructions stored thereon. The instructions, when executed by computer processor hardware, cause the computer processor hardware (such as one or more co-located or disparately located processor devices) to: sample a magnitude of current through a load, the magnitude of the current through the load varying over time during a time duration; produce a current sense value based on integrating sample magnitudes of the current through the load over the time duration, the current through the load controlled via a switch through which the current passes; and control an operational state of the switch based upon a comparison of the current sense value with respect to an over-current threshold value.

The ordering of the steps above has been added for clarity sake. Note that any of the processing steps as discussed herein can be performed in any suitable order.

Other embodiments of the present disclosure include software programs and/or respective hardware to perform any of the method embodiment steps and operations summarized above and disclosed in detail below.

It is to be understood that the system, method, apparatus, instructions on computer readable storage media, etc., as discussed herein also can be embodied strictly as a software program, firmware, as a hybrid of software, hardware and/or firmware, or as hardware alone such as within a processor (hardware or software), or within an operating system or a within a software application.

As discussed herein, techniques herein are well suited for use in the field of supporting switching power supplies. However, it should be noted that embodiments herein are not limited to use in such applications and that the techniques discussed herein are well suited for other applications as well.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of embodiments herein (BRIEF DESCRIPTION OF EMBODIMENTS) purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section (which is a summary of embodiments) and corresponding figures of the present disclosure as further discussed below.

Figure 1:
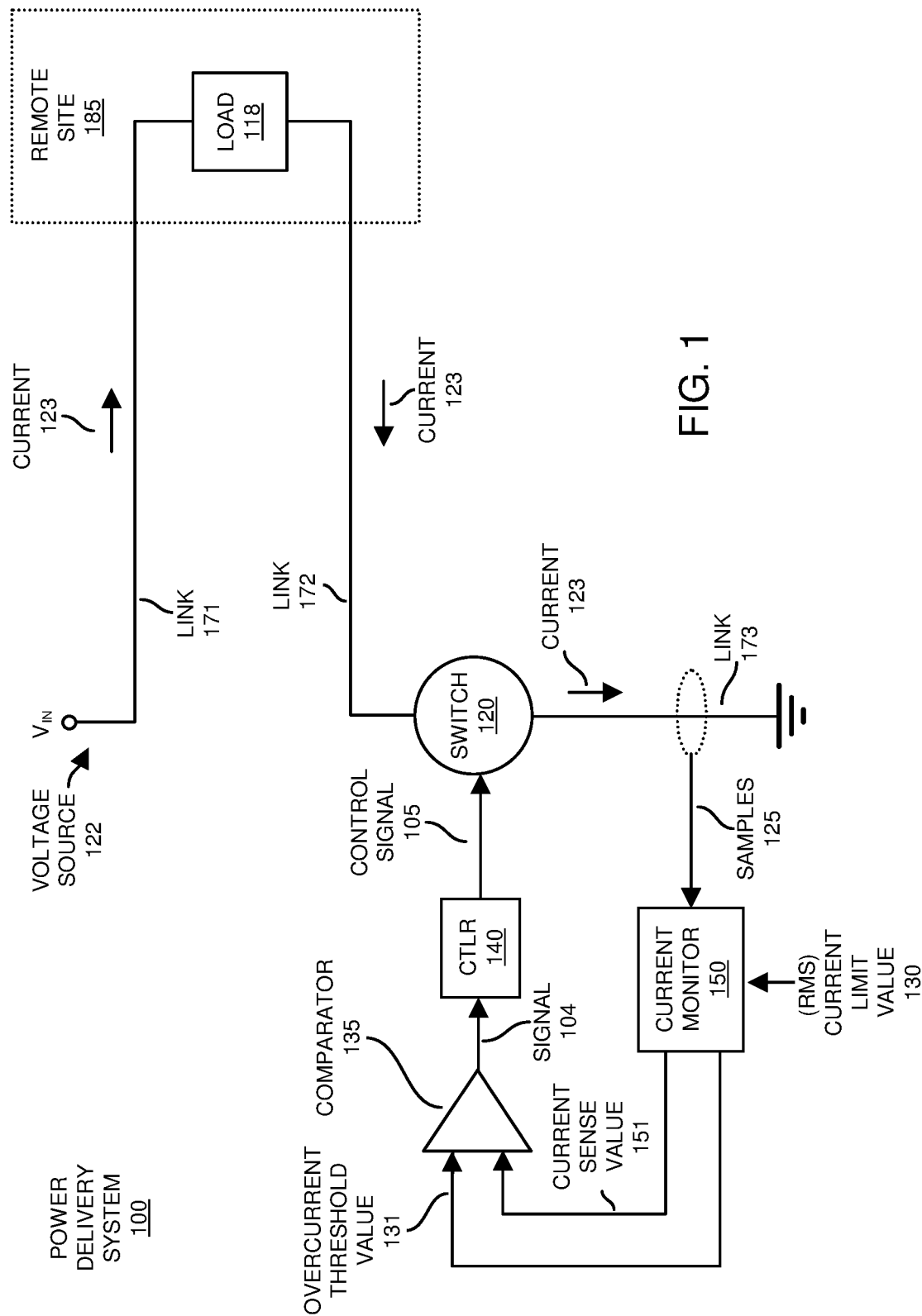
FIG. 1 is an example general diagram illustrating powering a respective load and monitoring for an overcurrent condition according to embodiments herein.

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

Embodiments herein include an apparatus comprising a switch, a current monitor, and a controller. During operation, the switch controls an amount of current through the load. The current monitor samples a magnitude of the current through the load, a magnitude of which varies over time during a time duration. Based on integrating the sample magnitudes of the current through the load over the time duration, the current monitor produces a current sense value. The current sense value is representative of an amount of current through the load. The controller controls an operational state of the switch based upon a comparison of the current sense value with respect to an over-current threshold value. For example, in response to detecting a condition in which the current sense value is greater than the overcurrent threshold value, the controller turns OFF (deactivates) the switch, reducing or eliminating delivery of current through the load.

Now, more specifically, FIG. 1 is an example general diagram illustrating powering a respective load and monitoring for an overcurrent condition according to embodiments herein.

As shown, the power delivery system 100 includes voltage source 122, link 171, the load 118, link 172, switch 120, link 173, current monitor 150, comparator 135, and controller 140.

Voltage source 122 provides an input voltage (Vin) that powers load 118 via supplied current 123. For example, in one embodiment, the voltage source 122 is connected to the load 118 via link 171 (such as wire, cable, etc.). Link 172 (such as wire, cable, etc.) provides connectivity between the load 118 and the switch 120. Activation of the switch 120 causes a flow of current 123 to pass through a circuit path including link 171, load 118, link 172, switch 120, and link 173 to a ground reference voltage.

In one embodiment, the current 123 consumed by the load 118 dynamically changes over time. In such an instance, the load 118 is susceptible to experiencing overcurrent conditions that may cause damage to any of one or more resources such as the load 118 itself, link 171, link 172, switch 120, and link 173. As described herein, the switch 120 controls current through the load 118 via the control signal 105 generated by the controller 140.

In one embodiment, the current monitor 150 receives samples 125 indicating a respective magnitude of current 123 delivered to the load 118 over different sample times. Thus, via the received samples 125, the current monitor 150 tracks a magnitude of the current 123 through the load 118.

As previously discussed, in one embodiment, a magnitude of current 123 varies over time. Alternatively, note that the load current 123 may be a fixed current delivered to the load 118.

In one embodiment, the current monitor 150 includes and/or implements an integrator function. Based on integrating the sample magnitudes of the current 123 through the load 118 over a time duration, the current monitor 150 produces a current sense value 151.

The current sense value 151 represents an amount of current 123 through the load 118. Based upon a comparison of the current sense value 151 with respect to an over-current threshold value 131, the controller 140 controls an operational state of the switch 120.

For example, the comparator 135 compares the magnitude of the current sense value 151 to the overcurrent threshold value 131. In response to detecting a condition in which the current sense value 151 is greater than the overcurrent threshold value 131, the comparator 135 produces the control signal 104 to indicate occurrence of an overcurrent condition. In such an instance, in response to detecting the overcurrent condition, the controller 140 initiates turning off (deactivating) the switch 120 such that the link 172 is no longer electrically connected via a low impedance path through the switch 120 to the link 173. Thus, deactivation (open circuit) of the switch 120 substantially reduces (or eliminates) any current 123 through the load 118.

Conversely, in response to detecting a condition in which the current sense value 151 is less than the overcurrent threshold value 131, the comparator 135 produces the signal 104 to indicate absence of an overcurrent condition associated with the load 118. In such an instance, the controller 140 continues to activate the switch 120 such that current 123 continues to flow from the voltage source 122 through the link 171, load 118, link 172, switch 120, and link 173.

As further discussed herein, the current monitor 150 can be configured to produce the current sense value 151 as a squared approximation of an RMS (Root Mean Square) current through the load 118 during a monitored time duration. In such an instance, the comparator 135 receives an RMS current limit value 130 to be used as a threshold value. The RMS current limit value 130 is programmable and can be changed depending upon a desired current protection threshold value. The current monitor 150 converts the received RMS current limit value 130 into the overcurrent threshold value 131 supplied to the comparator 135.

In one nonlimiting example embodiment, as further discussed herein, the current monitor 150 squares the received RMS (Root Mean Square) current limit value 130 to produce the overcurrent threshold value 131. In such an instance, the current monitor 150 compares the current sense value 151 (such as a squared approximation of the RMS current to the load 118) to the squared RMS current limit value 130 (i.e., the overcurrent threshold value 131) in order to determine a respective overcurrent condition associated with load current 123.

Figure 2:
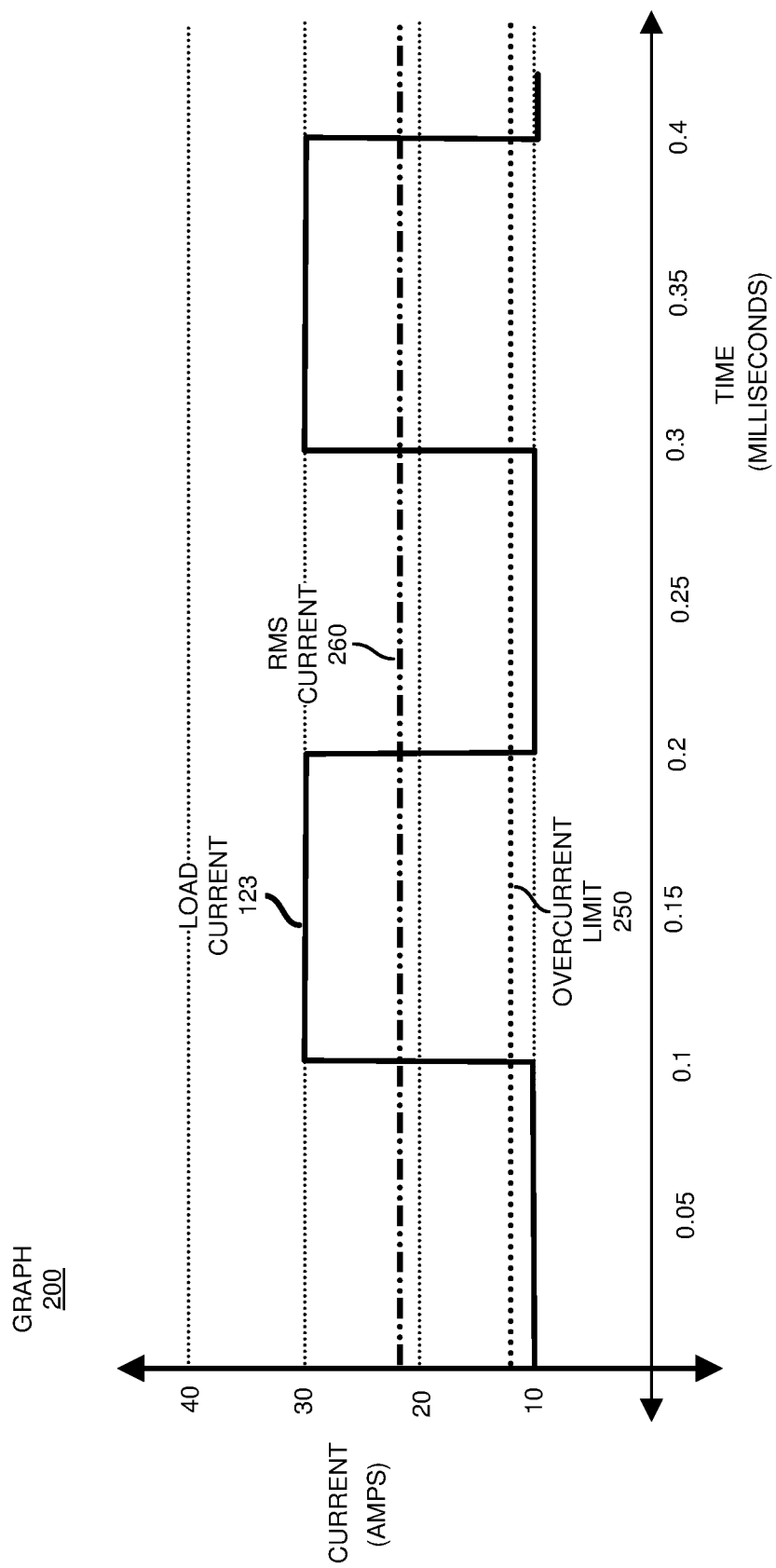
FIG. 2 is an example diagram illustrating variations in load current over time and generation of an RMS current value according to embodiments herein.

FIG. 2 is an example diagram illustrating variations in load current over time and generation of an RMS current value according to embodiments herein.

As previously discussed, conventional protection circuits such as smart e-fuses and hot swap controllers typically include an overcurrent (OC) protection function such as based on peak current detector with a deglitch time. In such an instance, the conventional overcurrent protection circuit will deactivate a respective switch in response to detecting that the magnitude of current 123 is at or above an overcurrent limit during a respective deglitch time.

As long as the deglitch time is not exceeded, current can alternate above and below the overcurrent limit threshold value, resulting in an RMS current 260 that is higher in magnitude than the maximum allowed overcurrent threshold level (such as overcurrent limit 250). Such a high RMS current 260 can cause damage to respective current carrying cables, so it is desirable to prevent the RMS current associated with current 123 from exceeding a save threshold value.

One type of over current protection includes implementation of a so-called Mechanical Circuit Breaker (MCB) unit, which is an electro-mechanical relay with over temperature control (RMS current flow heats the cables). Such an implementation is inaccurate and slow to react, which requires using cables with extra safety margin and thus forcing higher implementation costs.

As further discussed herein, embodiments herein include a smart e-fuse with integrated switch 120 (such as a field effect transistor or other suitable entity) and corresponding protection functions. Input to the power path is negative (GND) with respect to the supply voltage (RTN). The switch 120 protects the load 118 from overcurrent conditions by turning off and impeding the flow of current 123. For example, the controller 140 senses the magnitude of the current 123 by measuring the voltage drop across a shunt resistor. Based on sensed current through the resistor, the controller 140 controls the operation of the switch 120 depending on this level (among other protection and telemetry features).

Figure 3:
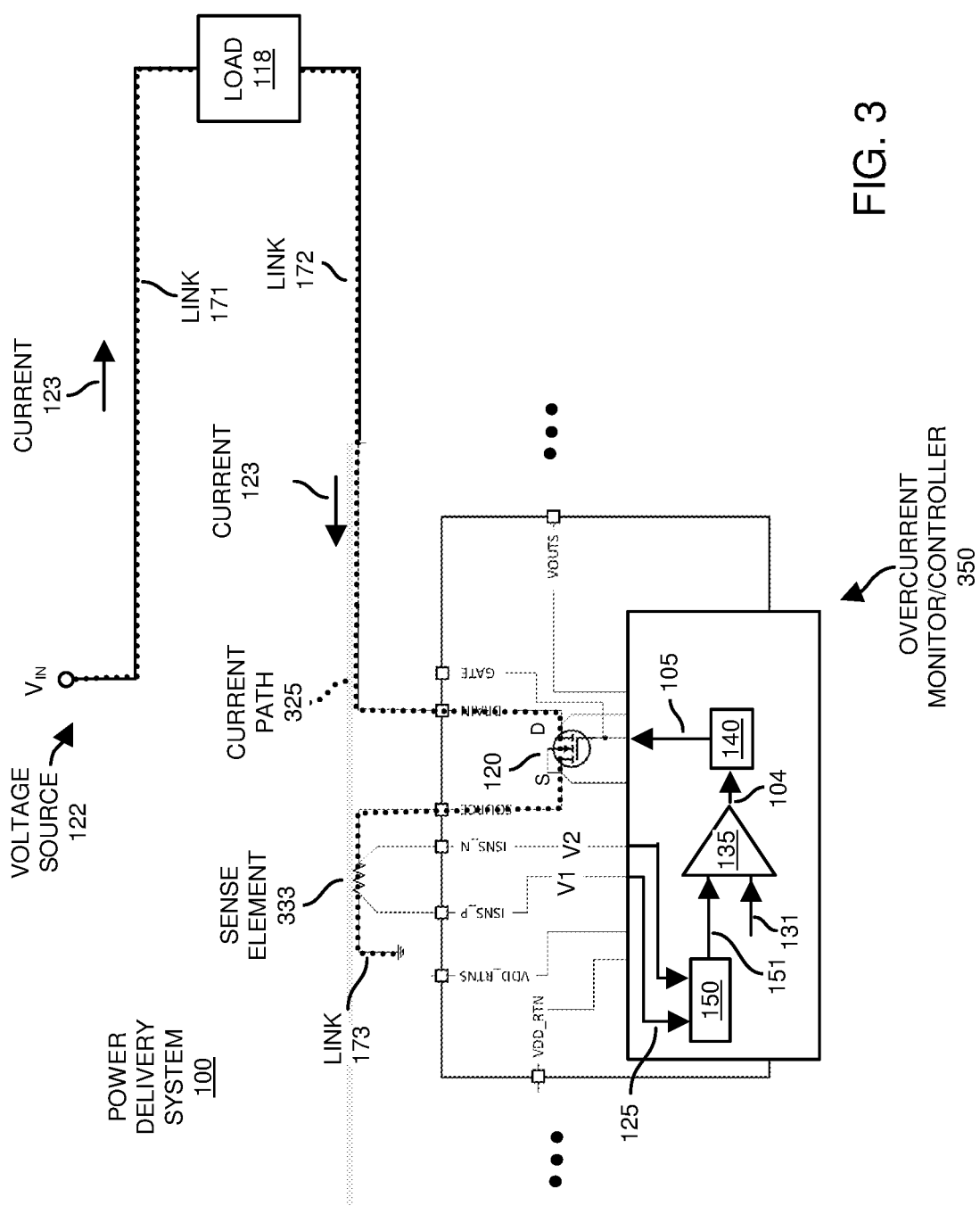
FIG. 3 is an example diagram illustrating monitoring a current path of current through a load in control of a respective switch in the current path according to embodiments herein.

FIG. 3 is an example diagram illustrating monitoring a current path of current through a load in control of a respective switch in the current path according to embodiments herein.

In this example embodiment, the power delivery system 100 includes overcurrent monitor/controller 350 as well as a sense element 333 disposed in the link 173. The overcurrent monitor-controller 350 includes switch 120, current monitor 150, comparator 135, and controller 140.

Current path 325 illustrates a flow of current from the voltage source through a combination of link 171, load 118, link 172, switch 120, link 173, and sense element 333. In such an instance, when the switch 120 is activated to an ON state, the current 123 passing through the sense element 333 produces a respective differential voltage V2−V1 that is monitored via the current monitor 150.

In one embodiment, the current monitor 150 includes an analog-to-digital converter and other circuitry operable to convert the differential voltage across the sense element 333 (such as a sense resistor having a resistance of Rsense ohms) into a respective sample values indicative of a magnitude of the current 123 at each respective sample time.

In one embodiment, implementation of overcurrent protection as described herein includes an RMS current OC detector. The overcurrent protection circuit can be instantiated by reusing available current sense circuitry of an existing controller or the circuit can be customized. In one embodiment, the deglitch time corresponds to the integration time. The main advantage of implementing embodiments herein is the simplicity and low cost that result from reusing the circuitries required for other telemetry and protection features of the smart e-fuse.

One implementation of the overcurrent protection circuitry as described herein is an ADC (Analog-to-Digital Converter) based current sense circuitry which provides digital switch/load current 123 tracking (current measurement samples with certain repetition rate).

In accordance with further example embodiments, the current monitor 150 and analog-to-digital converter that monitors voltage at ISNS_P/ISNS_N pins and converts the voltages to digital data such as a differential voltage across sense element 333 (such as an external shunt resistor Rsense). Samples 125 of the monitored differential voltage (V2−V1) represents the current 123 via the following equation:

Magnitude of Current 123=(*V*2−*V*1)/*R*sense    (equation 1)

The digital data from the ADC supports controller's telemetry and some protection features and can be used as input data for RMS current OC detector.

The RMS current is calculated digitally based on the equation below:

$$I_{RMS} \cong \sqrt{\frac{1}{N}\sum_{i=1}^{N} I_i^2}$$    (equation 2)

As further shown below, embodiments herein include squaring both sides of the equation 2 in order to avoid calculation of square root and significantly simplify digital implementation of the overcurrent monitor/controller 350 as follows:

$$I_{RMS}^2 \cong \frac{1}{N}\sum_{i=1}^{N} I_i^2$$    (equation 3)

More specific details of implementing the current monitor 150 and related circuitry are discussed in the following figure.

Figure 4:
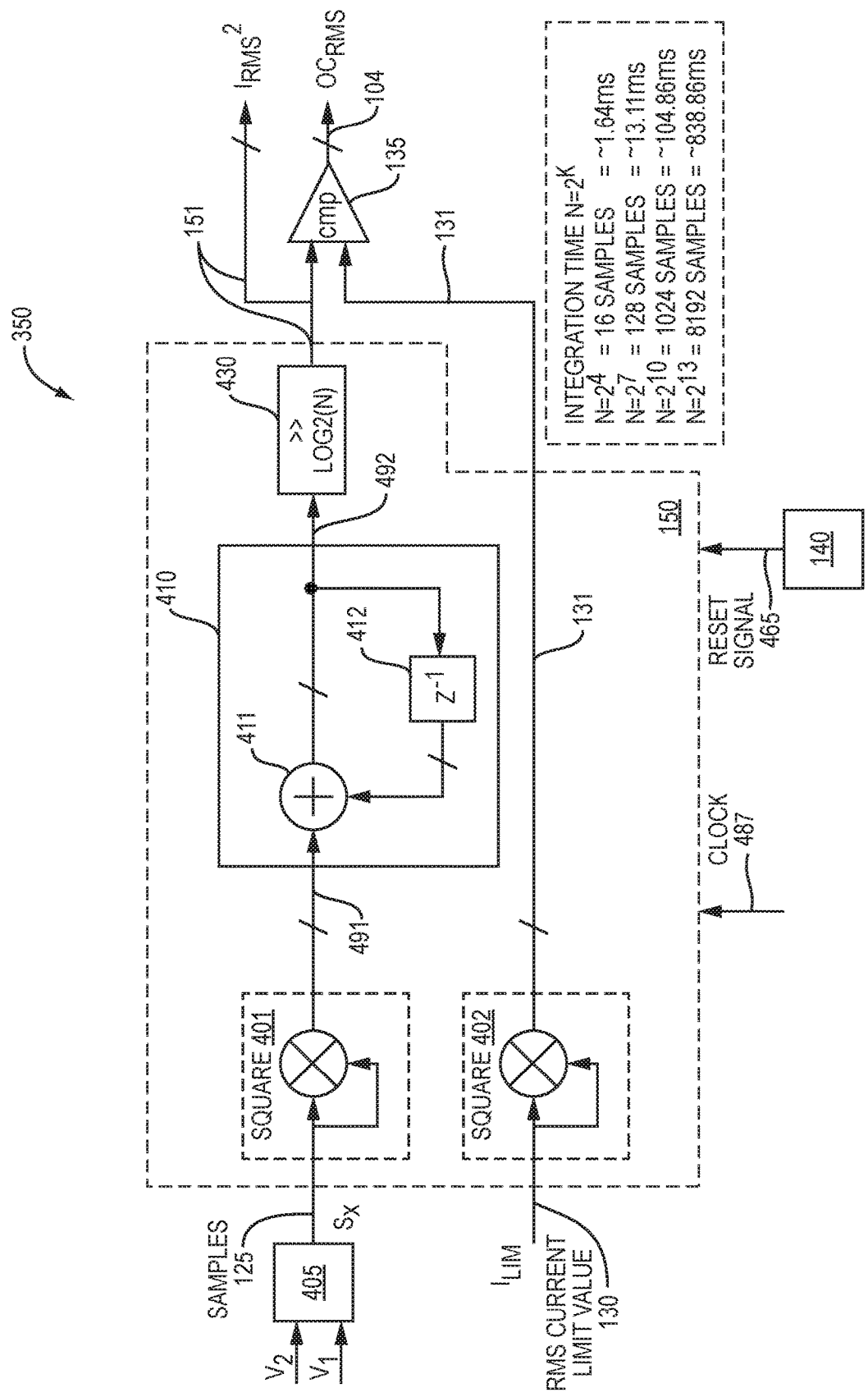
FIG. 4 is an example diagram illustrating a current monitor and related components according to embodiments herein

FIG. 4 is an example diagram illustrating a current monitor according to embodiments herein.

In this example embodiment, the overcurrent monitor/controller 350 includes a voltage sampler 405, multiplier stage 401, multiplier stage 402, integrator 410, divider 430, and comparator 135.

As shown, the voltage sampler 405 is coupled to the multiplier stage 401; multiplier stage 401 is coupled to the integrator 410; integrator 410 is coupled to the divider 430; divider 430 is coupled to a first input of comparator 135. Thus, a first signal path of the overcurrent monitor/controller 350 includes voltage sampler 405, multiplier stage 401, integrator 410, and divider 430.

In this example embodiment, the multiplier stage 401 provides a squaring function. For example, for a first sample period, the multiplier stage 401 receives sample Sx (a magnitude of the current 123), where x is an integer value, and produces a respective output value of Sx times Sx or $(Sx)^2$.

Multiplier stage 402 is coupled to the second input of the comparator 135. Thus, a second signal path of the overcurrent monitor/controller 350 includes a multiplier stage 402.

Further in this example embodiment, the multiplier stage 402 provides a squaring function as well. For example, the multiplier stage 402 receives threshold value Ilimit (such as an RMS current limit threshold value), and produces a respective output value of Ilimit times Ilimit or $(Ilimit)^2$. In one embodiment, the value Ilimit is a received current limit value selected for a particular application to prevent damage to any of one or more entities such as links 171, 172, 173, switch 120, load 118, etc.

During operation, the voltage sampler 405 monitors the differential voltage (V2−V1) across the sense element 333 and produces respective samples 125 indicative of a respective magnitude of the current 123 through the switch 120 and the load 118 during a sample time. Via implementation of a squaring function, the multiplier stage 401 produces the signal 491.

Integrator 410 includes summer 411 in buffer 412. As its name suggests, the integrator 410 sums the value of signal 491 over each of the multiple sample times of producing samples 125. The integrator 410 outputs signal 492 to the divider 430.

As its name suggests, the divider 430 produces the current sense value 151 via dividing the signal 492 received from the integrator 410 by a value of N. As described herein, value N represents the # of samples 125 taken in a sample cycle.

As previously discussed, the multiplier stage 402 produces the overcurrent threshold value 131 by squaring the received input Ilimit. In other words, the multiplier stage 402 produces the overcurrent threshold value 131 to be equal to $(Ilimit)^2$.

Comparator 135 compares the magnitude of the current sense value 151 and the overcurrent threshold value 131. Based on the comparison, the comparator 135 produces the status signal 104 indicating whether or not the RMS current 123 exceeds a respective overcurrent threshold value 131. As previously discussed, the controller 140 receives the status signal 104 and determines whether to activate or deactivate the switch 120.

Accordingly, via the current monitor 150, and in furtherance of producing the current sense value 131 as a squared approximation of an RMS (Root Mean Square) current through the load 118 during the integration time duration of N samples: via the multiplier stage 401, squaring each of the sample magnitudes of the current 123 over the time duration; via the integrator 410 and summer 411, summing the squared sample magnitudes of the current 123; and via the divider 430, dividing a summation (such as signal 492) of the squared sample magnitudes of the current by a predetermined value such as N.

In one embodiment, as previously discussed, the predetermined value N is based on or is indicative of a number of the sample magnitudes of the current 123 obtained during the sampling cycle time duration.

In accordance with further example embodiments, as previously discussed, the received current limit value (such as Ilimit) is an RMS (Root Mean Square) current limit value. The current sense value 131 produced by the multiplier stage 402 (that implements the respective squaring function) represents a squared approximation of an RMS (Root Mean Square) current through the load 118.

Accordingly, embodiments herein include, via the current monitor 150 and related compliments, deriving the current sense value 151 from the sample magnitudes (such as samples 125) of the current 123 through the load 118 over the integration time duration; and deriving the overcurrent threshold value 131 from a received current limit value Ilimit.

If desired, note that any or all of the components, resources, etc., as described herein can be implemented via analog circuitry, digital circuitry, or a combination of both.

Additional details of implementing the squared approximation of the RMS current 123 (current sense value 151) through the load 118 and comparison to a respective squared RMS current limit value (such as overcurrent threshold value 131) is further discussed below.

Figure 5:
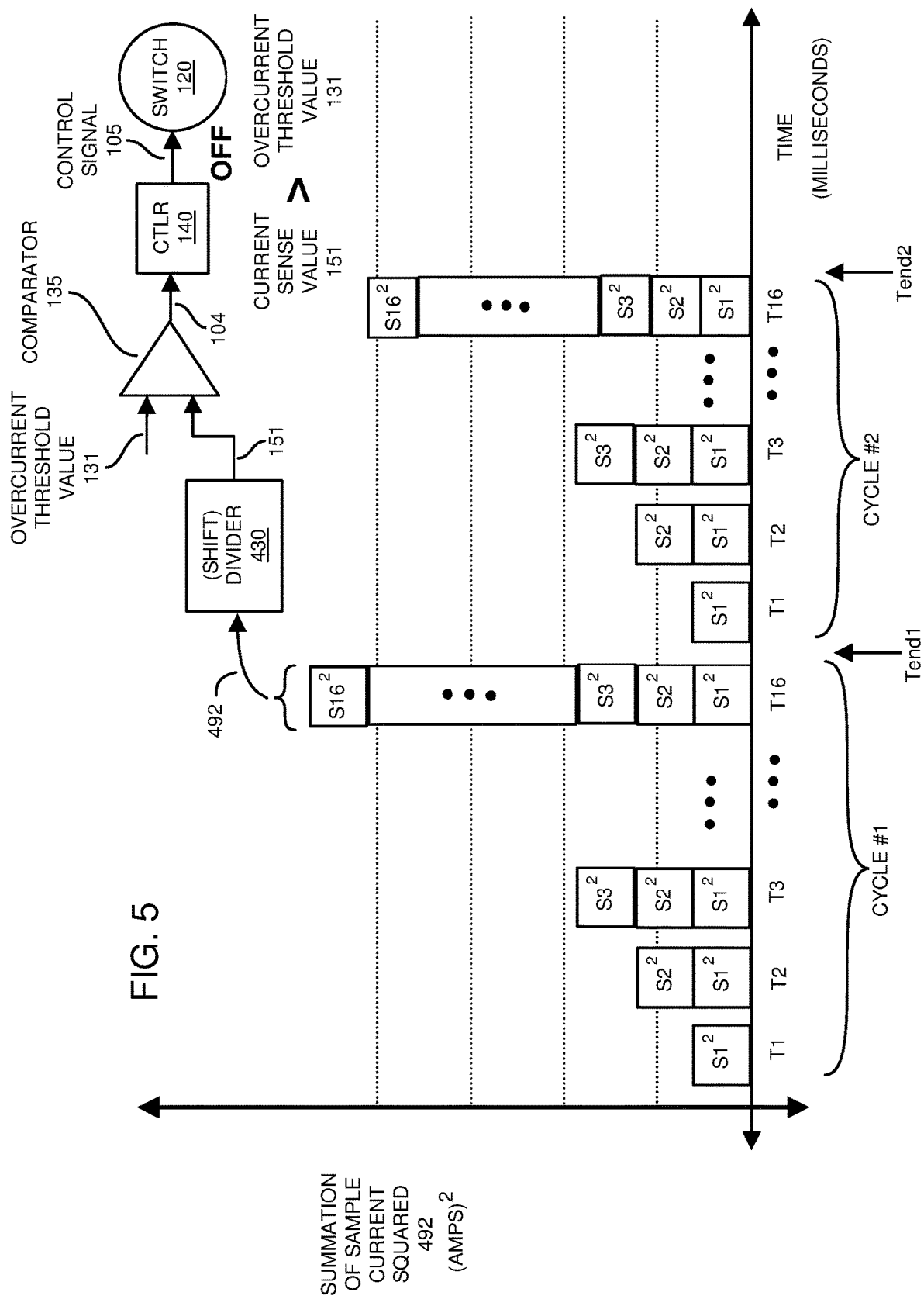
FIG. 5 is an example diagram illustrating overcurrent computations and deactivation of a respective switch in response to detecting an overcurrent condition according to embodiments herein.

FIG. 5 is an example diagram illustrating overcurrent computations and deactivation of a respective switch in response to detecting an overcurrent condition according to embodiments herein.

Assume in this example embodiment that the current monitor 150 implements an integration time (overcurrent detection cycle) based on sixteen samples 125 from the sense element 333. Each of the samples 125 represents a magnitude of the current through the load 118 and the switch 120. For example, each of the samples 125 represents a sampling of voltages V2−V1 divided by a resistance of the sense element 333 to determine whether an overcurrent condition occurs.

Note that the # of samples 125 in a respective integration cycle can vary depending upon the embodiment. For example, the number of samples in a cycle can be a suitable value such as $2^x$, where x is an integer value. In such an instance, the number of samples 125 per overcurrent detection cycle (such as value N) can be any value such as: $2^4$=16 samples 125 per integration cycle, $2^5$=32 samples 125 per integration cycle, $2^6$=64 samples 125 per integration cycle, . . . , $2^{10}$=1024 samples 125 per integration cycle, . . . , $2^{13}$=8192 samples 125 per integration cycle, etc.

Note further that the sampling time can vary depending on the embodiment and be any suitable value.

As further shown in FIG. 5, at time T1 of a respective integration cycle #1, the current monitor 150 receives a first current sample of S1=(V2−V1)/Rsense based on monitoring of the voltage (V2 and V1) across the sense element 333 at time T1. Again, Rsense is a resistance of the sense element 333. Via the multiplier stage 401, for the first sample S1 (S1=detected magnitude of current 123 at time T1), the current monitor 150 produces the signal 491 to be the value S1×S1=S1$^2$. Since the integrator 410 starts at an initial value of 0 for the start of a new integration cycle #1, the summer 411 sums the current value S1$^2$ to the prior value of 0 stored in buffer 412.

At time T2, the current monitor 150 receives a second current sample S2=(V2−V1)/Rsense based on monitoring of the voltage (V2 and V1) across the sense element 333 at time T2. S2 represents a magnitude of the current 123 through the sense element 333 at time T2. Via the multiplier stage 401, for the second sample S2, the current monitor 150 produces the signal 491 to be the value S2×S2=S2$^2$. The summer 411 of the integrator 410 sums the prior value S1$^2$ in buffer 412 and the new value of S2$^2$ and stores the sum S1$^2$+S2$^2$ in buffer 412.

At time T3, the current monitor 150 receives a third sample S3=(V2−V1)/Rsense based on monitoring of the voltage (V2 and V1) across the sense element 333 at time T3. S3 represents a magnitude of the current 123 through the sense element 333 at time T3. Via the multiplier stage 401, for the third sample S3, the current monitor 150 produces the signal 491 to be the value S3×S3=S3$^2$. The summer 411 of the integrator 410 sums the prior value S1$^2$+S2$^2$ and the new value of S3$^2$ and stores the sum S1$^2$+S2$^2$+S3$^2$ in buffer 412.

At time T4, the current monitor 150 receives a fourth sample S4 based on monitoring of the voltage (V2 and V1) across the sense element 333 at time T4. S4 represents a magnitude of the current 123 through the sense element 333 at time T4. Via the multiplier stage 401, for the fourth sample S4, the current monitor 150 produces the signal 491 to be the value S4×S4=S4$^2$. The summer 411 of the integrator 410 sums the prior value S1$^2$+S2$^2$+S3$^2$ and the new value of S4$^2$ and stores the sum S1$^2$+S2$^2$+S3$^2$+S4$^2$ in buffer 412.

At time T5, the current monitor 150 receives a fifth sample S5 based on monitoring of the voltage (V2 and V1) across the sense element 333 at time T5. S5 represents a magnitude of the current 123 through the sense element 333 at time T5. Via the multiplier stage 401, for the fifth sample S5, the current monitor 150 produces the signal 491 to be the value S5×S5=S5$^2$. The summer 411 of the integrator 410 sums the prior value S1$^2$+S2$^2$+S3$^2$+S4$^2$ and the new value of S5$^2$ and stores the sum S1$^2$+S2$^2$+S3$^2$+S4$^2$+S5$^2$ in buffer 412.

In this manner, the integrator 410 sums the squares of the sample magnitudes up to time T16. For example, finally, at time T16, the current monitor 150 receives a sixteenth current magnitude sample S16 (V2−V1)/Rsense based on monitoring of the voltage (V2 and V1) across the sense element 333 at time T16. S16 represents a magnitude of the current 123 through the sense element 333 at time T16. Via the multiplier stage 401, for the sixteenth sample S16, the current monitor 150 produces the signal 491 to be the value S16×S16=S16$^2$. The summer 411 of the integrator 410 sums the prior value S1$^2$+S2$^2$+S3$^2$+S4$^2$+S5$^2$+S6$^2$+S7$^2$+S8$^2$+S9$^2$+S10$^2$+S11$^2$+S12$^2$+S13$^2$+S14$^2$+S15$^2$ and the new value of S16$^2$ and stores the final sum S1$^2$+S2$^2$+S3$^2$+S4$^2$+S5$^2$+S6$^2$+S7$^2$+S8$^2$+S9$^2$+S10$^2$+S11$^2$+S12$^2$+S13$^2$+S14$^2$+S15$^2$+S16$^2$ in buffer 412.

As further shown in FIG. 5 (and as previously discussed in FIG. 4), divider 430 receives the signal 492 from the integrator 410 (such as a digital integrator). Signal 492 represents the final sum S1$^2$+S2$^2$+S3$^2$+S4$^2$+S5$^2$+S6$^2$+S7$^2$+S8$^2$+S9$^2$+S10$^2$+S11$^2$+S12$^2$+S13$^2$+S14$^2$+S15$^2$+S16$^2$ for the given integrator cycle #1. As its name suggests, the divider 430 divides the final sum as indicated by signal 492 by the value N=16. As previously discussed, the value N represents the # of samples received and processed for the given cycle #1.

In one embodiment, the divider 430 is a bit shifting divider in which the divider 430 shifts (to the right) the final sum as indicated by the signal 492 by 4 bits because N=16. Each single bit shift by the divider 430 represents a divide of the final sum by two. Thus, a bit shift of 4 results in a divide by 16. Accordingly, the final result generated by the divider 430 is current sense value 151 equal to $(S1^2+S2^2+S3^2+S4^2+S5^2+S6^2+S7^2+S8^2+S9^2+S10^2+S11^2+S12^2+S13^2+S14^2+S15^2+S16^2)/16$.

At the end of the integrator cycle #1, such as at time Tend1, the comparator 135 compares the received current sense value 151 to the overcurrent threshold value 131. In response to detecting that the current sense value 151 is greater than the overcurrent threshold value 131, the comparator 135 produces the signal 104 to indicate a respective RMS overcurrent condition. As a response to the overcurrent condition, the controller 140 produces the respective control signal 105 to shut off or deactivate the switch 120. The activation of the switch 120 prevents current 123 from flowing through the load 118 and assures that the one or more of links 171, 172, 173, load 118, switch 120, etc., are not exposed to high currents that would cause them damage.

Figure 6:
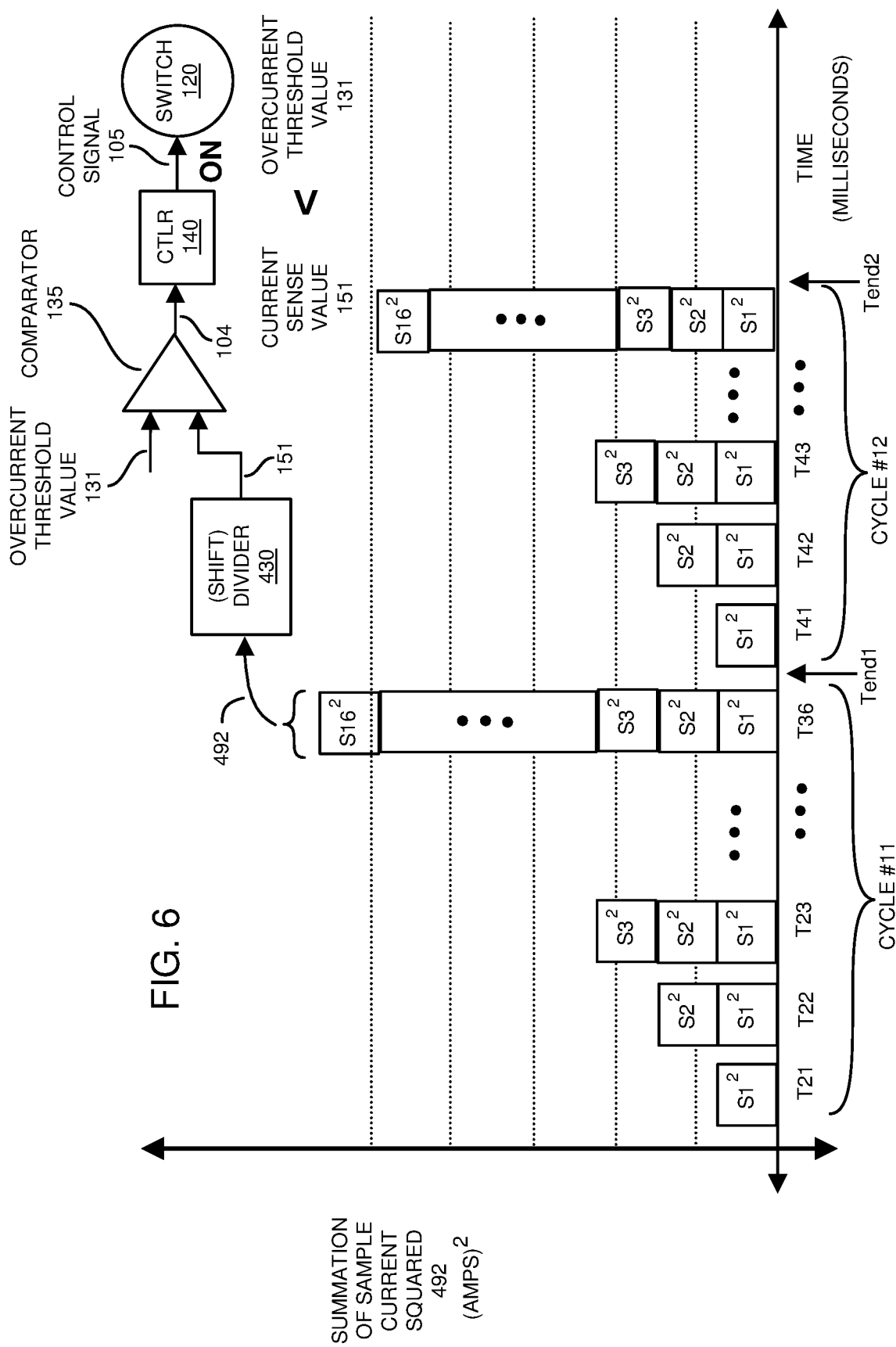
FIG. 6 is an example diagram illustrating overcurrent computations and continued activation of a respective switch in response to detecting no overcurrent condition according to embodiments herein.

FIG. 6 is an example diagram illustrating overcurrent computations and continued activation of a respective switch in response to detecting an overcurrent condition according to embodiments herein.

Assume in this example embodiment that the current monitor 150 implements an integration time (overcurrent detection cycle) based on sixteen samples 125 from the sense element 333. Each of the samples 125 represents a magnitude of the current through the load 118 and the switch 120. For example, each of the samples 125 represents a sampling of voltages V2-V1 divided by a resistance of the sense element 333 to determine whether an overcurrent condition occurs.

As further shown in FIG. 6, at time T21, the current monitor 150 receives a first current sample of S1=(V2−V1)/Rsense based on monitoring of the voltage (V2 and V1) across the sense element 333 at time T21. Again, Rsense is a resistance of the sense element 333). Via the multiplier stage 401, for the first sample S1 (S1=detected magnitude of current 123 at time T21), the current monitor 150 produces the signal 491 to be the value $S1 \times S1 = S1^2$. Since the integrator 410 starts at an initial value of 0 for the start of a new integration cycle, the summer 411 sums the current value $S1^2$ to the prior value of 0 stored in buffer 412.

At time T22, the current monitor 150 receives a second current sample S2=(V2−V1)/Rsense based on monitoring of the voltage (V2 and V1) across the sense element 333 at time T22. S2 represents a magnitude of the current 123 through the sense element 333 at time T22. Via the multiplier stage 401, for the second sample S2, the current monitor 150 produces the signal 491 to be the value $S2 \times S2 = S2^2$. The summer 411 of the integrator 410 sums the prior value $S1^2$ in buffer 412 and the new value of $S2^2$ and stores the sum $S1^2+S2^2$ in buffer 412.

At time T23, the current monitor 150 receives a third sample S3=(V2−V1)/Rsense based on monitoring of the voltage (V2 and V1) across the sense element 333 at time T23. S3 represents a magnitude of the current 123 through the sense element 333 at time T23. Via the multiplier stage 401, for the third sample S3, the current monitor 150 produces the signal 491 to be the value $S3 \times S3 = S3^2$. The summer 411 of the integrator 410 sums the prior value $S1^2+S2^2$ and the new value of $S3^2$ and stores the sum $S1^2+S2^2+S3^2$ in buffer 412.

At time T24, the current monitor 150 receives a fourth sample S4 based on monitoring of the voltage (V2 and V1) across the sense element 333 at time T24. S4 represents a magnitude of the current 123 through the sense element 333 at time T24. Via the multiplier stage 401, for the fourth sample S4, the current monitor 150 produces the signal 491 to be the value $S4 \times S4 = S4^2$. The summer 411 of the integrator 410 sums the prior value $S1^2+S2^2+S3^2$ and the new value of $S4^2$ and stores the sum $S1^2+S2^2+S3^2+S4^2$ in buffer 412.

At time T25, the current monitor 150 receives a fifth sample S5 based on monitoring of the voltage (V2 and V1) across the sense element 333 at time T25. S5 represents a magnitude of the current 123 through the sense element 333 at time T25. Via the multiplier stage 401, for the fifth sample S5, the current monitor 150 produces the signal 491 to be the value $S5 \times S5 = S5^2$. The summer 411 of the integrator 410 sums the prior value $S1^2+S2^2+S3^2+S4^2$ and the new value of $S5^2$ and stores the sum $S1^2+S2^2+S3^2+S4^2+S5^2$ in buffer 412.

In this manner, the integrator 410 sums the squares of the sample magnitudes up to time T36. For example, finally, at time T36, the current monitor 150 receives a sixteenth current magnitude sample S16 (V2−V1)/Rsense based on monitoring of the voltage (V2 and V1) across the sense element 333 at time T36. S16 represents a magnitude of the current 123 through the sense element 333 at time T16. Via the multiplier stage 401, for the sixteenth sample S16, the current monitor 150 produces the signal 491 to be the value $S16 \times S16 = S16^2$. The summer 411 of the integrator 410 sums the prior value $S1^2+S2^2+S3^2+S4^2+S5^2+S6^2+S7^2+S8^2+S9^2+S10^2+S11^2+S12^2+S13^2+S14^2+S15^2$ and the new value of $S16^2$ and stores the final sum $S1^2+S2^2+S3^2+S4^2+S5^2+S6^2+S7^2+S8^2+S9^2+S10^2+S11^2+S12^2+S13^2+S14^2+S15^2+S16^2$ in buffer 412.

As further shown in FIG. 6 (and as previously discussed in FIG. 4), divider 430 receives the signal 492 from the integrator 410 (such as a digital integrator). Signal 492 represents the final sum $S1^2+S2^2+S3^2+S4^2+S5^2+S6^2+S7^2+S8^2+S9^2+S10^2+S11^2+S12^2+S13^2+S14^2+S15^2+S16^2$ for the given integrator cycle #11. As its name suggests, the divider 430 divides the final sum as indicated by signal 492 by the value N=16. As previously discussed, the value N represents the # of samples received and processed for the given cycle #11.

In one embodiment, the divider 430 is a bit shifting divider in which the divider 430 shifts (to the right) the final sum as indicated by the signal 492 by 4 bits because N=16. Each single bit shift by the divider 430 represents a divide of the final sum by two. Thus, a bit shift of 4 results in a divide by 16. Accordingly, the final result generated by the divider 430 is current sense value 151 equal to $(S1^2+S2^2+S3^2+S4^2+S5^2+S6^2+S7^2+S5^2+S9^2+S10^2+S11^2+S12^2+S13^2+S14^2+S15^2+S16^2)/16$.

At the end of the integrator cycle #11, such as at time Tend1, the comparator 135 compares the received current sense value 151 to the overcurrent threshold value 131. In response to detecting that the current sense value 151 is less than the overcurrent threshold value 131, the comparator 135 produces the signal 104 to indicate that there is no respective RMS overcurrent condition. As a response to detecting no overcurrent condition, the controller 140 produces the respective control signal 105 to continue to activate the switch 120. The activation of the switch 120 causes current 123 to flow through the load 118.

Embodiments in herein are useful over conventional techniques. For example, sampling of the current through a load and producing a respective current sense value for a corresponding integration cycle time duration as described herein provides a way to detect RMS conditions that should cause a respective shutdown of a respective load. Additionally, the novel integration (such as summing) of squared current samples over multiple sampling cycles and implementation of a bit shifting division produces a current sense value representing a squared approximation of an RMS (Root Mean Square) current through the load and comparison to a squared RMS (Root Mean Square) current value simplifies circuitry needed to implement overcurrent protection.

Figure 7:
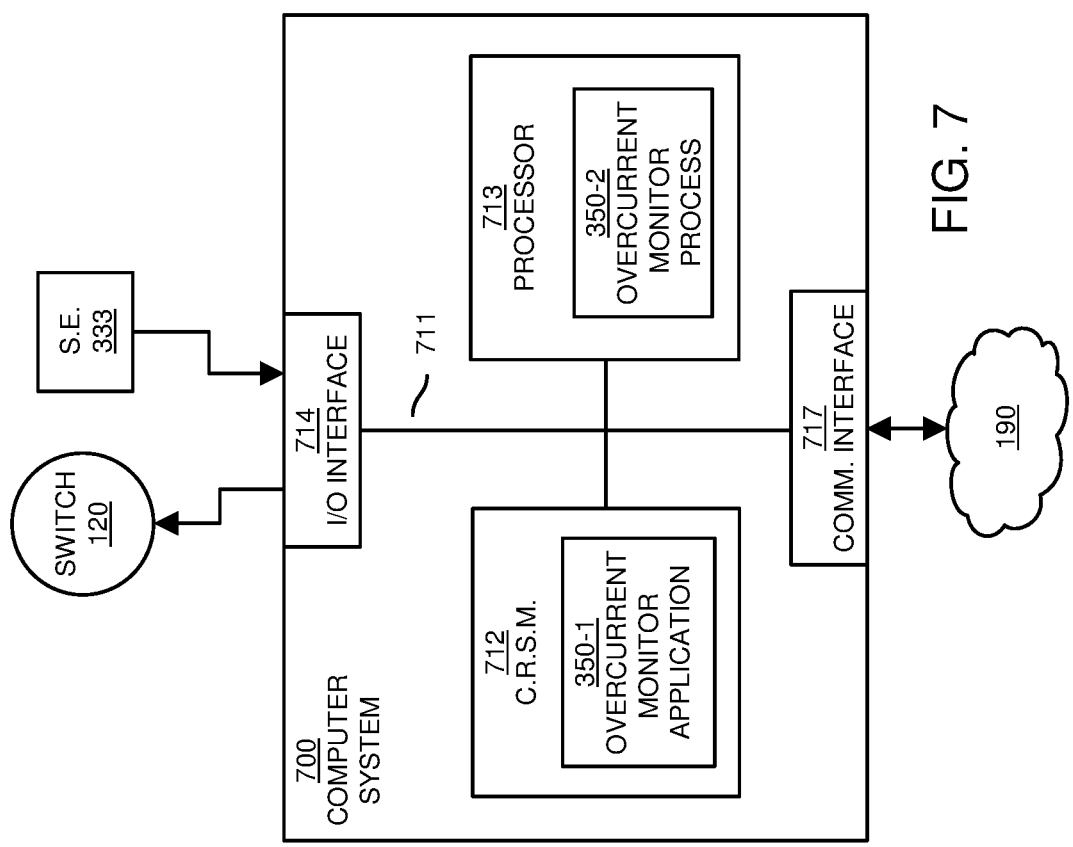
FIG. 7 is an example diagram illustrating computer processor hardware and related software instructions that execute methods according to embodiments herein.

FIG. 7 is an example block diagram of a computer device for implementing any of the operations as discussed herein according to embodiments herein.

As shown, computer system 700 and overcurrent monitor application 155-1 (such as implemented by any of one or more resources such as controller 140, current monitor 150, comparator 135, etc.) of the present example includes an interconnect 711 that couples computer readable storage media 712 such as a non-transitory type of media (or hardware storage media) in which digital information can be stored and retrieved, a processor 713 (e.g., computer processor hardware such as one or more processor devices), I/O interface 714, and a communications interface 717.

I/O interface 714 provides connectivity to any suitable circuitry such as sense element 333, switch 120, etc.

Computer readable storage medium 712 can be any hardware storage resource or device such as memory, optical storage, hard drive, floppy disk, etc. In one embodiment, the computer readable storage medium 712 stores instructions and/or data used by the overcurrent monitor/control application 350-1 to perform any of the operations as described herein.

Further in this example embodiment, communications interface 717 enables the computer system 700 and processor 713 to communicate over a resource such as network 190 to retrieve information from remote sources and communicate with other computers.

As shown, computer readable storage media 712 is encoded with overcurrent monitor/control application 350-1 (e.g., software, firmware, etc.) executed by processor 713. Overcurrent monitor/control application 350-1 can be configured to include instructions to implement any of the operations as discussed herein.

During operation of one embodiment, processor 713 accesses computer readable storage media 712 via the use of interconnect 711 in order to launch, run, execute, interpret or otherwise perform the instructions in overcurrent monitor/control application 350-1 stored on computer readable storage medium 712.

Execution of the overcurrent monitor/control application 350-1 produces processing functionality such as overcurrent monitor/control process 350-2 in processor 713. In other words, the overcurrent monitor/control process 350-2 associated with processor 713 represents one or more aspects of executing overcurrent monitor/control application 350-1 within or upon the processor 713 in the computer system 700.

In accordance with different embodiments, note that computer system 700 can be a micro-controller device, logic, hardware processor, hybrid analog/digital circuitry, etc., configured to control a power supply and perform any of the operations as described herein.

Functionality supported by the different resources will now be discussed via flowchart in FIG. 8. Note that the steps in the flowcharts below can be executed in any suitable order.

Figure 8:
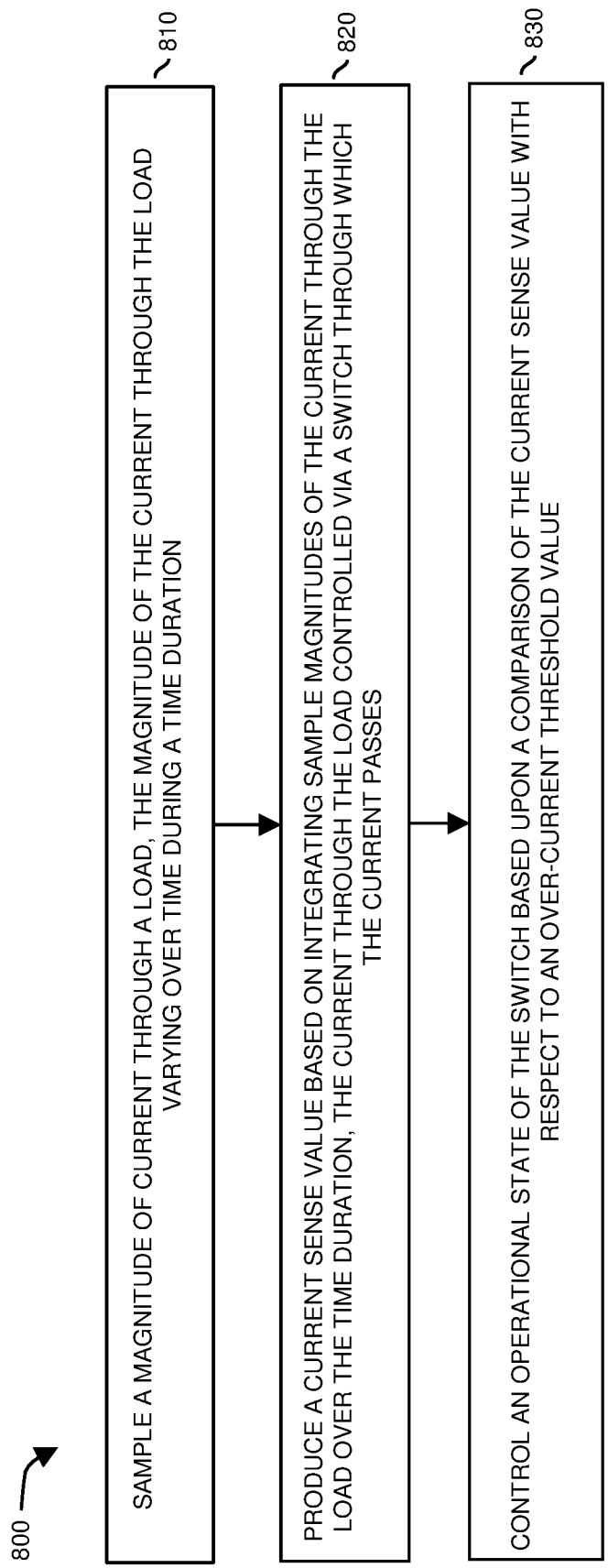
FIG. 8 is an example diagram illustrating a method according to embodiments herein.

FIG. 8 is an example diagram illustrating a method of controlling a switch based on monitored current according to embodiments herein.

In processing operation 810, the current monitor 150 samples a magnitude of current 123 (via samples 125) through a load 118. In one embodiment, the magnitude of the current 123 through the load 118 varies over time during a time duration (such as a respective overcurrent integrator cycle).

In processing operation 820, the current monitor 150 produces a current sense value 151 based on integrating sample magnitudes of the current 123 through the load 118 over the time duration. The current 123 through the load 118 is controlled via a switch 120 through which the current 123 passes.

In processing operation 830, the controller 140 controls an operational state of the switch 120 based upon (such as at an end of a respective integration cycle) a comparison of the current sense value 151 with respect to the over-current threshold value 131.

Figure 9:
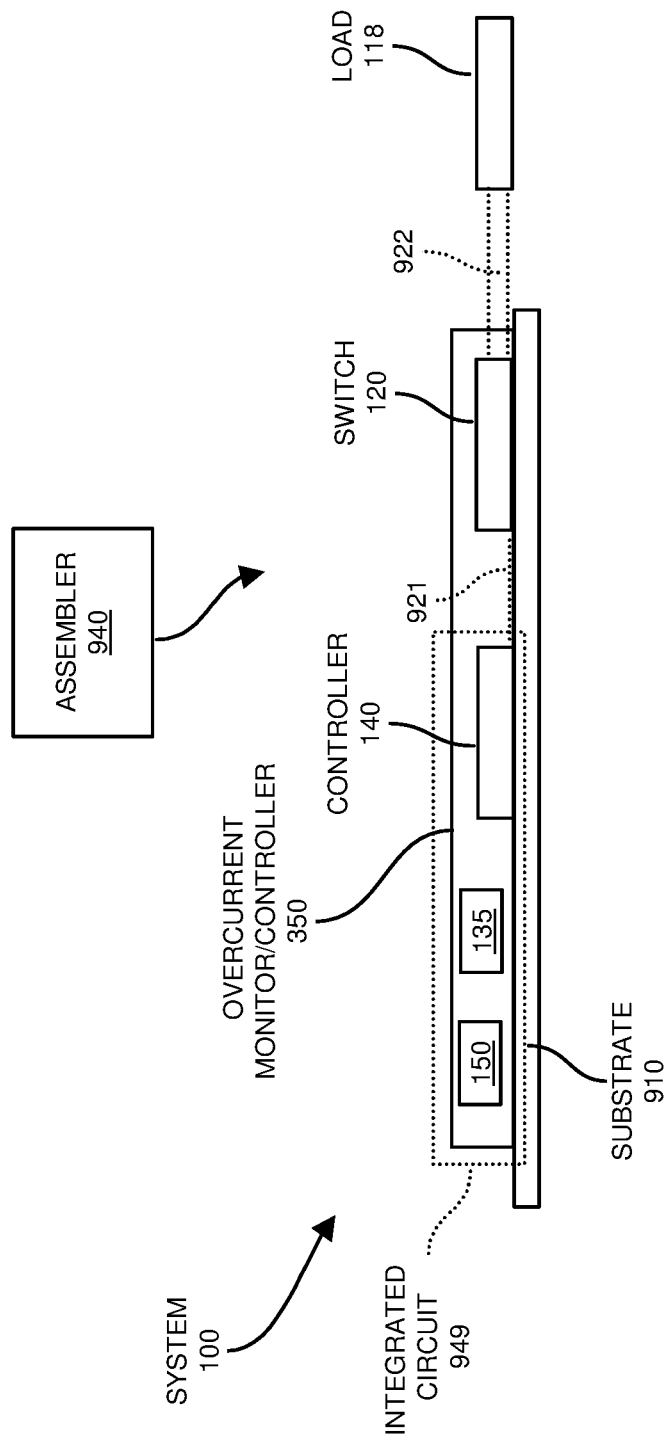
FIG. 9 is an example diagram illustrating fabrication of a circuit according to embodiments herein.

FIG. 9 is an example diagram illustrating assembly of a circuit board including a current monitor and controller according to embodiments herein.

In this example embodiment, assembler 940 receives a substrate 910 (such as a circuit board).

The assembler 940 further affixes (couples) the overcurrent monitor/controller 350 (such as including monitor 150, comparator 135, controller 140, switch 120, etc.) to the substrate 910.

Via one or more circuit paths 921 (such as one or more traces, electrical conductors, cables, wires, etc.), the assembler 940 or other suitable entity couples the controller 140 to the switch 120.

Note that components such as the monitor 150, comparator 135, controller 140, switch 120, etc., can be affixed or coupled to the substrate 910 in any suitable manner. For example, one or more of the components in system 100 can be soldered to the substrate, inserted into one or more respective sockets on the substrate 910, etc. In one embodiment, combination of the monitor 150, comparator 135, and controller 140, and/or switch 120 are fabricated in an integrated circuit 949 (a.k.a., chip, semiconductor device, etc.).

Note further that the substrate 910 is optional. If desired, circuit paths 922 (such as one or more of links 171, 172, 173, etc.) or other components in system 100 can be disposed in cables or other suitable resource.

Via one or more circuit paths 922 (such as one or more traces, cables, connectors, wires, conductors, electrically conductive paths, etc.), the assembler 940 provides connectivity of the overcurrent monitor/controller 350 to the load 118. In one embodiment, the circuit paths 922 conveys the output current 123 from the overcurrent monitor/controller to and through the load 118 and back to the overcurrent monitor/controller 350.

Accordingly, embodiments herein include a system comprising: a substrate 910 (such as a circuit board, standalone board, mother board, standalone board destined to be coupled to a mother board, host, etc.); an overcurrent monitor/controller 350 including corresponding components as described herein; and a load 118. As previously discussed, the load 118 is powered based on conveyance of output current 123 conveyed over one or more paths 922 (such as links 171, 172, 173, etc.).

Note again that techniques herein are well suited for providing overcurrent protection to a respective load. However, it should be noted that embodiments herein are not limited to use in such applications and that the techniques discussed herein are well suited for other applications as well.

Based on the description set forth herein, numerous specific details have been set forth to provide a thorough understanding of claimed subject matter. However, it will be understood by those skilled in the art that claimed subject matter may be practiced without these specific details. In other instances, methods, apparatuses, systems, etc., that would be known by one of ordinary skill have not been described in detail so as not to obscure claimed subject matter. Some portions of the detailed description have been presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm as described herein, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has been convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

The invention claimed is:

1. An apparatus comprising:
a switch, an operational state of which controls delivery of current through a load, a magnitude of the current through the load varying over time;
a current monitor operative to produce, for each of multiple cycles of monitoring the magnitude of the current, a current sense value based on multiple integrated sample magnitudes of the current over a respective time duration for each of the multiple cycles;
a divider operative to divide a summation of the multiple integrated sample magnitudes of the current produced for the respective time duration depending on a number of the sample magnitudes used to produce the summation; and
a controller operative to control the operational state of the switch based upon comparison, via a comparator, of the current sense value to an over-current threshold value.

2. The apparatus as in claim 1, wherein the current sense value represents a squared approximation of an RMS (Root Mean Square) current through the load during the respective time duration.

3. The apparatus as in claim 1, wherein the current monitor is operative to receive a current limit value; and
wherein the over-current threshold value represents a square of the RMS current limit value.

4. The apparatus as in claim 1, wherein the current monitor includes:
a multiplier stage operative to produce the sample magnitudes of the current over the respective time duration, the sampled magnitudes being squared sampled magnitudes generated by the multiplier stage;
an integrator operative to sum the squared sample magnitudes of the current for the respective time duration and produce the summation; and
wherein the divider is operative to bit shift divide the summation to produce the current sense value.

5. The apparatus as in claim 1, wherein a first signal path of the current monitor includes a first multiplier stage, the first multiplier stage operative to derive the current sense value based at least in part on the sample magnitudes of the current over the respective time duration, the sample magnitudes being squared sample magnitudes of the current; and
wherein a second signal path of the current monitor includes a second multiplier stage, the second multiplier stage operative to derive the over-current threshold value based at least in part on squaring a received current limit value.

6. The apparatus as in claim 5, wherein the received current limit value is an RMS (Root Mean Square) current value.

7. The apparatus as in claim 6, wherein the current sense value represents a squared approximation of an RMS (Root Mean Square) current through the load.

8. The apparatus as in claim 1, wherein the current monitor includes a first circuit path and a second circuit path inputted to a comparator, the first circuit path operative to receive the sample magnitudes of the current over the respective time duration, the second circuit path operative to derive the overcurrent threshold value from a received current limit value.

9. The apparatus as in claim 8, wherein the first circuit path includes a first multiplier stage, the first multiplier stage operative to derive the current sense value based at least in part on squaring each of the received sample magnitudes of the current over the respective time duration.

10. The apparatus as in claim 9,
wherein the second circuit path of the current monitor includes a second multiplier stage, the second circuit path operative to produce the overcurrent threshold value based on squaring the received current limit value.

11. A system comprising:
a circuit substrate;
the apparatus of claim 1, the apparatus coupled to the circuit substrate; and
wherein the load is coupled to the substrate.

12. A method comprising:
receiving a circuit substrate; and
coupling the apparatus of claim 1 to the circuit substrate.

13. The apparatus as in claim 1, wherein the current monitor is operative to receive a current limit value and produce the over-current threshold value from the current limit value; and
wherein the over-current threshold value represents a square of the current limit value.

14. The apparatus as in claim 1, wherein the sample magnitudes of the current are digital samples.

15. The apparatus as in claim 1, wherein the sample magnitudes of the current are squared sample magnitudes of the current.

16. An apparatus comprising:
a switch, an operational state of which controls delivery of current through a load, a magnitude of the current through the load varying over time during a time duration;
a current monitor operative to produce a current sense value based on integrating sample magnitudes of the current over the time duration;
a controller operative to control the operational state of the switch based upon comparison, via a comparator, of the current sense value to an over-current threshold value;
wherein the current monitor includes a first circuit path and a second circuit path inputted to a comparator, the first circuit path operative to receive the sample magnitudes of the current over the time duration, the second circuit path operative to derive the overcurrent threshold value from a received current limit value;
wherein the first circuit path includes a first multiplier stage, the first multiplier stage operative to derive the current sense value based at least in part on squaring each of the received sample magnitudes of the current over the time duration; and
wherein the second circuit path of the current monitor includes a multiplier stage, the second circuit path operative to produce the overcurrent threshold value based on squaring the received current limit value;
wherein the first circuit path of the current monitor includes an integrator operative to sum the squares of the sample magnitudes of the current; and
wherein the first circuit path of the current monitor includes a divider operable to divide a summation of the squares of the sample magnitudes of the current by a predetermined value.

17. The apparatus as in claim 16, wherein the predetermined value is based on a number of the sample magnitudes of the current obtained during the time duration.

18. A method comprising:
sampling a magnitude of current through a load, the magnitude of the current through the load varying over time during a time duration;
for each of multiple cycles of sampling the magnitude of the current, producing a current sense value based on multiple integrated squared sample magnitudes of the current through the load over a respective time duration for each of the multiple cycles, the current through the load controlled via a switch through which the current passes;
dividing a summation of the multiple integrated squared sample magnitudes of the current produced for the respective time duration depending on a number of the squared sample magnitudes used to produce the summation; and
controlling an operational state of the switch based upon a comparison of the current sense value with respect to an over-current threshold value.

19. The method as in claim 18 further comprising:
producing the current sense value as a squared approximation of an RMS (Root Mean Square) current through the load during the respective time duration.

20. The method as in claim 18 further comprising:
receiving a current limit value; and
squaring the current limit value to produce the overcurrent threshold value.

21. The method as in claim 18 further comprising:
producing the squared sample magnitudes of the current over the respective time duration;
summing the squared sample magnitudes of the current for the respective time duration to produce the summation; and
wherein dividing the summation includes bit shift dividing the summation of the squared sample magnitudes of the current to produce the current sense value.

22. The method as in claim 18 further comprising:
via a first multiplier stage, deriving the current sense value based at least in part on summing the squared sample magnitudes of the current over the respective time duration; and
via a second multiplier stage, deriving the overcurrent threshold value based at least in part on squaring a received current limit value.

23. The method as in claim 22, wherein the overcurrent threshold value is an RMS (Root Mean Square) current limit value.

24. The method as in claim 23, wherein the current sense value represents a squared approximation of an RMS (Root Mean Square) current through the load.

25. The method as in claim 18 further comprising:
deriving the current sense value from the squared sample magnitudes of the current over the respective time duration; and
deriving the overcurrent threshold value from a received current limit value.

26. The method as in claim 25 further comprising:
deriving the current sense value based at least in part on summing the squared sample magnitudes of the current over the respective time duration.

27. The method as in claim 26 further comprising:
producing the overcurrent threshold value based on squaring the received current limit value.

28. An apparatus comprising:
a switch, an operational state of which controls delivery of current through a load, a magnitude of the current through the load varying over time;
a current monitor operative to produce, for each of multiple cycles of monitoring the magnitude of the current, a current sense value based on integrating squared sample magnitudes of the current over a respective time duration for each of the multiple cycles;
a controller operative to control the operational state of the switch based upon comparison, via a comparator, of the current sense value to an over-current threshold value; and wherein the current monitor includes:
a multiplier stage operative to produce the squared sample magnitudes of the current over the respective time duration; an integrator operative to sum the squared sample magnitudes of the current;
wherein the current monitor further includes: a divider operative to divide a summation of the squared sample magnitudes of the current by a predetermined value, the predetermined value being based on a number of the squared sample magnitudes of the current summed for the respective time duration.

29. An apparatus comprising
a switch, an operational state of which controls delivery of current through a load, a magnitude of the current through the load varying over time;
a current monitor operative to produce, for each of multiple cycles of monitoring the magnitude of the current, a current sense value based on integrating sample magnitudes of the current over a respective time duration for each of the multiple cycles;
a controller operative to control the operational state of the switch based upon comparison, via a comparator, of the current sense value to an over-current threshold value; and
wherein the respective time duration represents a deglitch integration time.

30. An apparatus comprising:
a switch, an operational state of which controls delivery of current through a load, a magnitude of the current through the load varying over time;
a current monitor operative to produce, for each of multiple cycles of monitoring the magnitude of the current, a current sense value based on integrating sample magnitudes of the current over a respective time duration for each of the multiple cycles;
a controller operative to control the operational state of the switch based upon comparison, via a comparator, of the current sense value to an over-current threshold value; and
an integrator operative to, for each respective cycle of the multiple control cycles, initially set a summation value of integrating the sample magnitudes of the current to zero at a beginning of the respective cycle.

31. The apparatus as in claim 30, wherein the sample magnitudes of the current are squared sample magnitudes of the current; and
wherein the current monitor is operative to add the squared sample magnitudes of the current to produce the summation value for the respective cycle.

32. The apparatus as in claim 30, wherein the sample magnitudes are squared sample magnitudes.

\* \* \* \* \*

UNITED STATES PATENT AND TRADEMARK OFFICE
CERTIFICATE OF CORRECTION

PATENT NO. : 11,482,853 B2
APPLICATION NO. : 16/995012
DATED : October 25, 2022
INVENTOR(S) : Aliaksandr Subotski et al.

It is certified that error appears in the above-identified patent and that said Letters Patent is hereby corrected as shown below:

In the Claims

Column 19, Claim 29, Line 1, replace "comprising" with --comprising:--

Signed and Sealed this
Tenth Day of January, 2023

Katherine Kelly Vidal
*Director of the United States Patent and Trademark Office*